(12) United States Patent
Miyamoto

(10) Patent No.: US 7,206,179 B2
(45) Date of Patent: Apr. 17, 2007

(54) CONTROL DEVICE OF SWITCHING DEVICE AND CONTROL DEVICE OF DRIVING CIRCUIT OF MOTOR

(75) Inventor: Noboru Miyamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 242 days.

(21) Appl. No.: 10/834,085

(22) Filed: Apr. 29, 2004

(65) Prior Publication Data

US 2005/0128671 A1    Jun. 16, 2005

(30) Foreign Application Priority Data

Dec. 10, 2003   (JP)  ............... 2003-411304

(51) Int. Cl.
*H02H 9/00*   (2006.01)
(52) U.S. Cl. ...................................... 361/118
(58) Field of Classification Search ................. 361/118
See application file for complete search history.

(56) References Cited

U.S. PATENT DOCUMENTS 6,570,780 B2 *   5/2003   Furukawa et al. ............ 363/98

6,720,792 B2 *   4/2004   Raftari et al. ............... 324/772

FOREIGN PATENT DOCUMENTS

| JP | 5-111143 | 4/1993 |
|---|---|---|
| JP | 6-291631 | 10/1994 |
| JP | 8-21861 | 1/1996 |
| JP | 11-18291 | 1/1999 |
| JP | 2000-83370 | 3/2000 |
| JP | 2001-217697 | 8/2001 |

* cited by examiner

*Primary Examiner*—Robert L. Deberadinis
*Assistant Examiner*—Lucy Thomas
(74) *Attorney, Agent, or Firm*—Oblon, Spivak, McClelland, Maier & Neustadt, P.C.

(57) ABSTRACT

A control device includes a capacitor disposed between P–N lines and constituting a snubber circuit, and a voltage detection resistor for detecting a voltage between the P–N lines by dividing resistances to detect surge voltages of transistors, in which gate control signals are provided from drivers to the transistors through gate resistance variable devices, respectively. The gate resistance variable devices include variable resistors, respectively, and the resistance values of the variable resistors are controlled based on variable resistor control signals provided from a detected voltage monitoring device, respectively.

9 Claims, 9 Drawing Sheets

CONTROL DEVICE OF SWITCHING DEVICE AND CONTROL DEVICE OF DRIVING CIRCUIT OF MOTOR

BACKGROUND OF THE INVENTION

1. Field of the Invention

The present invention relates to a control device of switching devices, and more particularly to a control device of switching devices including a snubber circuit for suppressing a surge voltage.

2. Description of the Background Art

Power convertors such as inverters use a power MOSFET, an IGBT (Insulated Gate Bipolar Transistor) or the like as switching devices. Suppression of a surge voltage at switching time and power loss reduction present important problems in those switching devices.

For example, Japanese Patent Application Laid-Open No. 2001-217697 (FIG. 1) discloses a driving device of a semiconductor device which, by connecting two resistance variable means to a gate of a switching device a surge voltage of which should be suppressed, dividing a control voltage and applying it to the switching device as a gate voltage, suppresses a temporal variation in the gate voltage to suppress the surge voltage at switching time.

The driving device of the semiconductor device disclosed in the Japanese Patent Application Laid-Open No. 2001-217697 is configured with no consideration given to a snubber circuit. The addition of a snubber circuit to that configuration may result in an increase in the surge voltage or an increase in power loss in case a malfunction occurs in the snubber circuit. When it is used to control a motor of a hybrid car (a car using a motor and an engine as a power source), for example, the driving device may interfere with the car's drive in case a malfunction occurs in the snubber circuit.

SUMMARY OF THE INVENTION

It is an object of the present invention to provide a control device of switching devices that prevents an increase in surge voltage and an increase in power loss even when a malfunction occurs in a snubber circuit for suppressing a surge voltage included in the switching devices, and to provide a control device of a driving circuit of a motor of a car including the control device.

The control device of the switching devices according to the present invention includes: driving devices performing drive and control of the switching devices; a snubber circuit for suppressing a surge voltage generated during a switching operation of the switching devices; a voltage detection device detecting a voltage between main electrodes of the switching devices; a detected voltage monitoring device monitoring the voltage detected by the voltage detection device to detect the surge voltage; and control state changing devices changing a control state of the switching devices based on instructions provided from the detected voltage monitoring device. The detected voltage monitoring device has first and second predetermined values to be compared with the surge voltage, and suppresses the surge voltage by providing instructions to the control state changing devices so that a transition of the control state of the switching devices takes place from a normal control state to a first control state when the surge voltage exceeds the first predetermined value, and providing instructions to the control state changing devices so that a transition of the control state of the switching devices takes place from the first control state to a second control state when the surge voltage exceeds the second predetermined value while the switching devices are in the first control state.

The surge voltage is suppressed by providing the instructions to the control state changing devices so that the transition of the control state of the switching devices takes place from the normal control state to the first control state when the surge voltage exceeds the first predetermined value, and providing the instructions to the control state changing devices so that the transition of the control state of the switching devices takes place from the first control state to the second control state when the surge voltage exceeds the second predetermined value while the switching devices are in the first control state. Consequently, it is possible to prevent a malfunction from occurring in the switching devices without leaving a malfunction in the snubber circuit unaddressed. Further, in detecting a snubber circuit malfunction, the predetermined first and second values are used as an index of a malfunction judgment and the malfunction judgment is made in two stages. Consequently, the occurrence of erroneous judgments is reduced.

The control device of the driving circuit of the motor according to the present invention includes the control device of the switching devices mentioned above, the motor being included as a driving source of the car.

The control device of the driving circuit of the motor prevents a malfunction from occurring in the switching devices without leaving a malfunction in the snubber circuit unaddressed, thereby contributing to the vehicle's drive. Further, it is possible to prevent the car's operation from being interfered with due to the switching device malfunction.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 schematically illustrates a current flow when a transistor is turned on;

DESCRIPTION OF THE PREFERRED EMBODIMENTS

<Preferred Embodiment>

A preferred embodiment of a control device of switching devices according to the present invention will be described with reference to FIGS. 1 to 7.

<A. Device Configuration>

Figure 1:
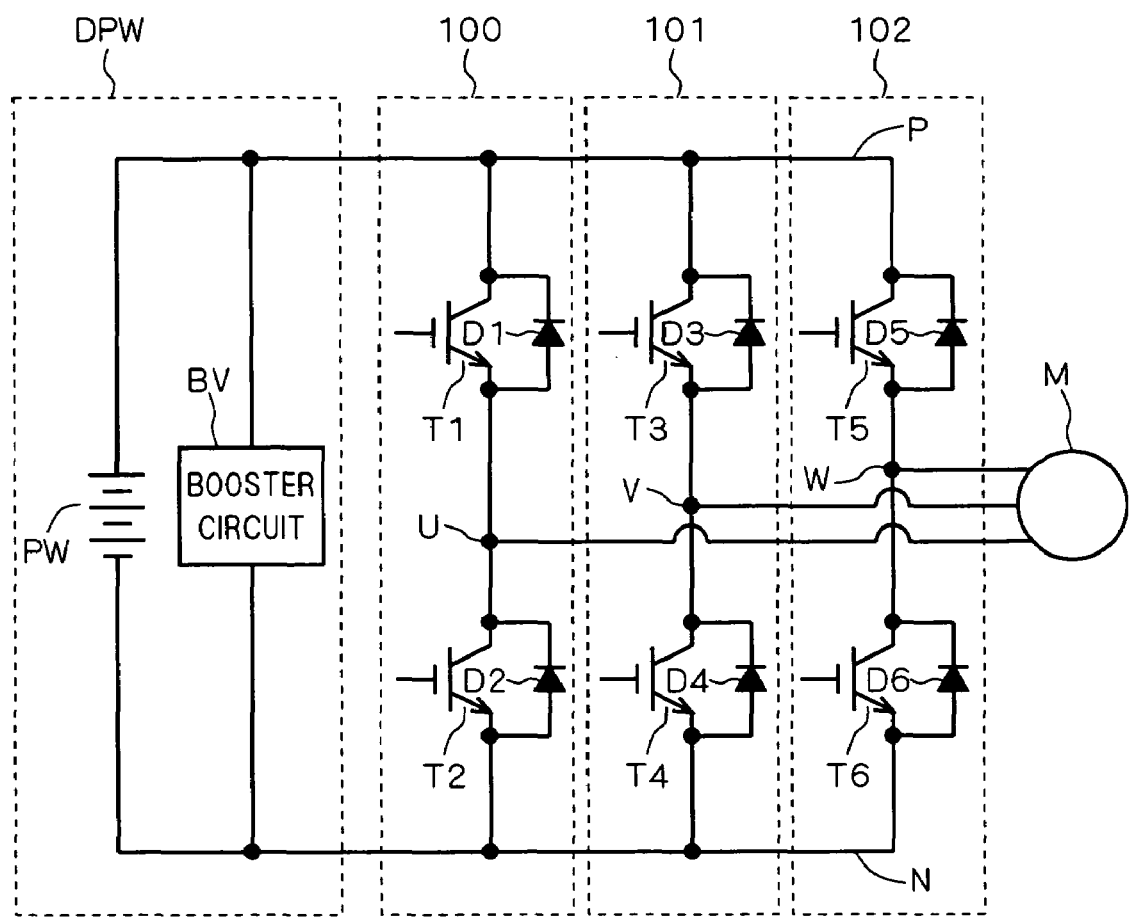
FIG. 1 illustrates a configuration of a driving circuit of a three-phase motor including power convertors each including a control device of switching devices according to the present invention.

FIG. 1 illustrates a configuration of a driving circuit of a three-phase motor including power convertors each including the control device of the switching devices according to the invention. As shown in FIG. 1, a main power supply DPW serving as a power supply of the three-phase motor M is disposed between P–N lines, and inverters 100, 101, 102 are independently connected as the power convertors to each phase of the motor M.

The inverters 100, 101, 102 include pairs of transistors T1 and T2, T3 and T4, T5 and T6, respectively, the transistors being power devices such as an IGBT totem-pole-connected between the P–N lines. The totem-pole-connected transistors T1 and T2, T3 and T4, T5 and T6 each form a half bridge, and an input terminal of each phase of the motor M is connected to output terminals U, V, W of the pairs, respectively. Further, freewheel diodes D1 to D6 are connected in antiparallel to the transistors T1 to T6, respectively.

The main power supply DPW includes a power supply PW and a booster circuit BV which boosts a voltage supplied from the power supply PW. A voltage output from the booster circuit BV serves as an output voltage from the main power supply DPW.

The components of the inverters 100, 101, 102 other than the transistors and the diodes will now be described in detail with reference to FIG. 2, taking the case of the inverter 100.

Figure 2:
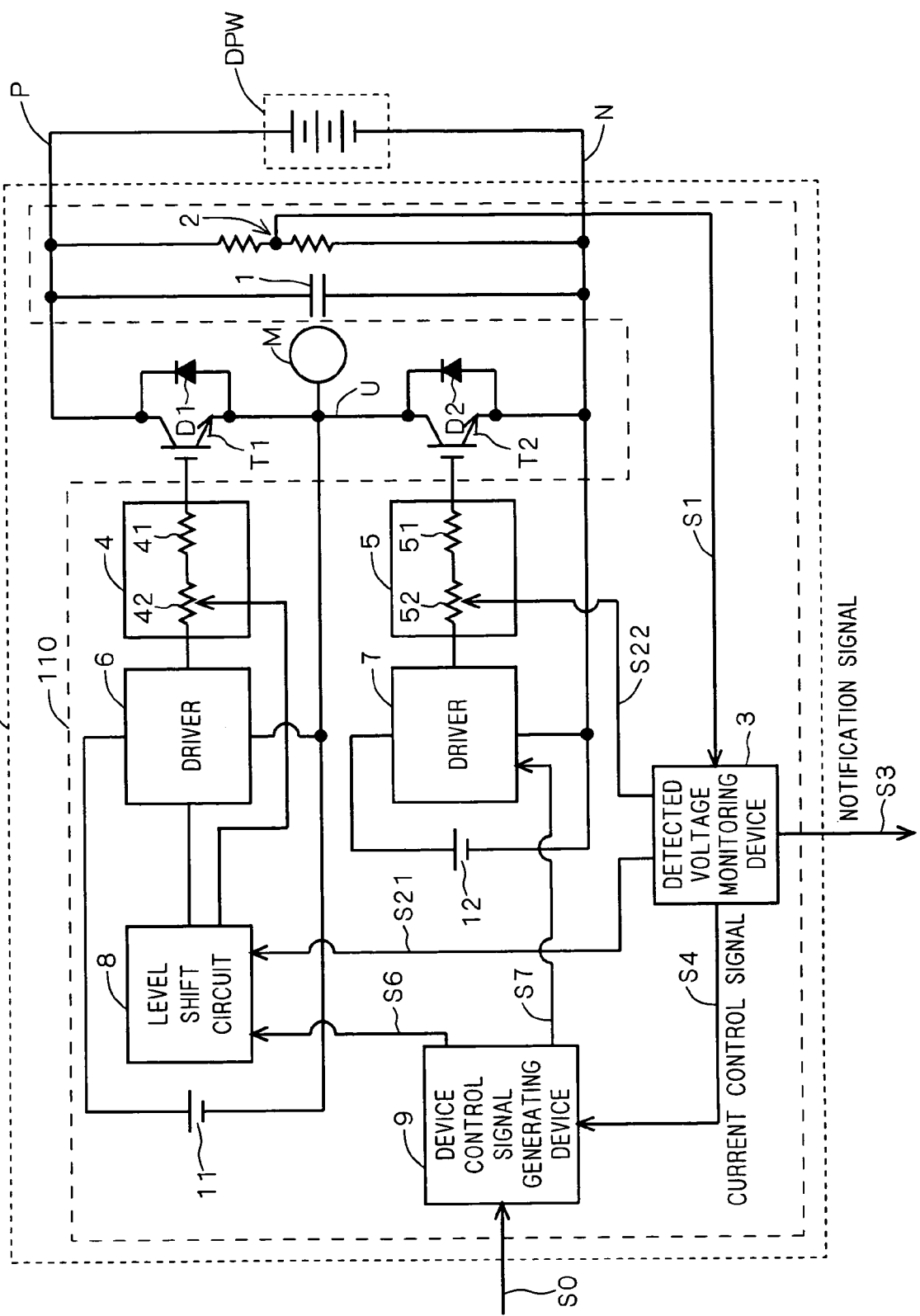
FIG. 2 illustrates a configuration of an inverter including the control device of the switching devices according to the invention.

As shown in FIG. 2, the inverter 100 includes an inverter control device 110 providing gate control signals complimentarily to the transistors T1 and T2 connected between the P–N lines to alternately perform on-off control thereof, a capacitor 1 disposed between the P–N lines and constituting a snubber circuit, and a voltage detection resistor (voltage detection device) 2 detecting a voltage between the P–N lines by dividing resistances to detect surge voltages of the transistors T1 and T2. The gate control signals are provided to the transistors T1 and T2 from drivers (driving devices) 6 and 7 included in the inverter control device 110, respectively.

The transistor T1 on the side of the P line serving as a power line performs a switching operation between a potential of the output terminal U serving as a reference potential and a power supply potential supplied from the main power supply DPW, and is also called a high-potential side device. The transistor T2 performs a switching operation between a ground potential serving as a reference potential and the potential of the output terminal U, and is also called a low-potential side device.

The drivers 6 and 7 are driven by power supplies 11 and 12, respectively, and are controlled based on pulsed control signals S6 and S7 provided from a device control signal generating device 9, respectively. The pulsed control signal S6, which is generated with the ground potential as a reference potential and thus cannot be provided directly to the driver 6 on the high-potential side, is provided to the driver 6 through a level shit circuit 8 generating pulsed signals in accordance with positive and negative level transitions of the control signal S6.

The device control signal generating device 9 is controlled by an input signal S0 provided from an outside of the inverter 100.

The level shift circuit 8 is realized by a MOS transistor having high breakdown voltage, for example, and the drivers 6 and 7 are realized by CMOS inverters or another corresponding configuration. In either case, an explanation of the configuration, which is well known, is omitted.

The gate control signals serving as outputs from the drives 6 and 7 are provided to the transistors T1 and T2 through gate resistance variable devices (control state changing devices) 4 and 5, respectively.

The gate resistance variable device 4 includes a fixed resistor 41 and a variable resistor 42, and the gate resistance variable device 5 includes a fixed resistor 51 and a variable resistor 52. The resistance values of the variable resistors 42 and 52 are controlled based on variable resistor control signals S21 and S22 provided from a detected voltage monitoring device 3, respectively.

The variable resistor control signal S21, which is generated with the ground potential as a reference potential and thus cannot be provided directly to the variable resistor 42 on the high-potential side, is provided to the variable resistor 42 through the level shit circuit 8.

Now, the variable resistor 52 is taken as an example and an exemplary configuration thereof will be described with reference to FIG. 3.

Figure 3:
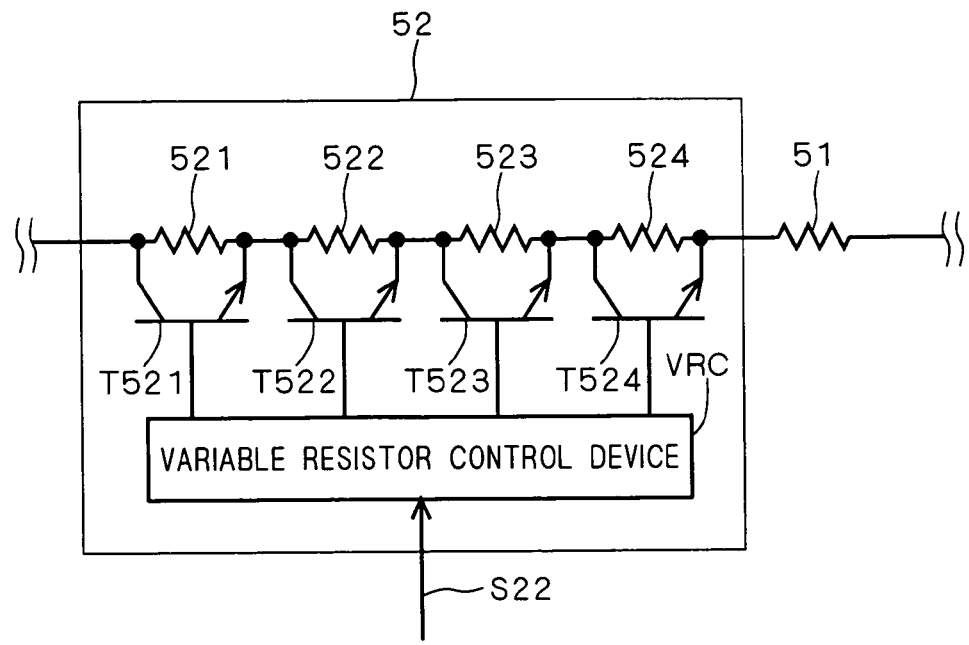
FIG. 3 explains an exemplary configuration of a gate resistance variable device.

As shown in FIG. 3, the variable resistor 52 includes a plurality of resistors (resistors 521, 522, 523 and 524 in this case) connected in series, transistors (bipolar transistors T521, T522, T523 and T524 in this case) connected in parallel to the resistors, respectively, and a variable resistance control device VRC applying voltages to bases of the transistors T521 to T524 to perform on-off control of the transistors T521 to T524. The variable resistance control device VRC turns a predetermined combination of the transistors T521 to T524 on or off in accordance with the variable resistor control signal S22 provided from the detected voltage monitoring device 3, thereby obtaining a desired resistance value.

When the transistors T1 and T2 are in a normal control state, the gate resistances of the transistors T1 and T2 are set to correspond to the resistance values of the fixed resistors 41 and 51, respectively, and the resistance values of the variable resistors 42 and 52 are set to be nearly equal to zero. When the resistance values need to be controlled, the variable resistors 42 and 52 are controlled to increase the gate resistances.

The variable resistance control device VRC may be realized by an integrated circuit whose application is specified, such as an ASIC (Application Specific Integrated Circuit).

The invention is not restricted to the exemplary configuration shown in FIG. 3 having the plurality of resistors connected in series. It is needless to say that a more minute adjustment can be made to the resistance values by incorporating a configuration having resistors connected in parallel.

Attention will now return to FIG. 2.

The detected voltage monitoring device 3 receives the voltage detected at the voltage detection resistor 2 as a signal S1, has functions of determining the necessity for changing the control state of the transistors T1 and T2 based on a comparison result between the signal S1 and a predetermined value, generating and outputting the variable resistor control signals S21 and S22 based on the determination result, and when the control state of the transistors T1 and T2 has been changed, outputting a notification signal S3 to that effect to the outside, and is constituted by including a microcomputer, for example.

The detected voltage monitoring device 3 also has a function of providing the device control signal generating device 9 with a current control signal S4, thereby controlling a main current flowing to the transistors T1 and T2.

<B. Device Operation>

<B-1. Relationship Between Gate Resistance and Surge Voltage>

Prior to an operation explanation of the inverter control device 110, a relationship between a gate resistance and a surge voltage of a switching device will be described with reference to FIGS. 4 to 6.

Figure 4:
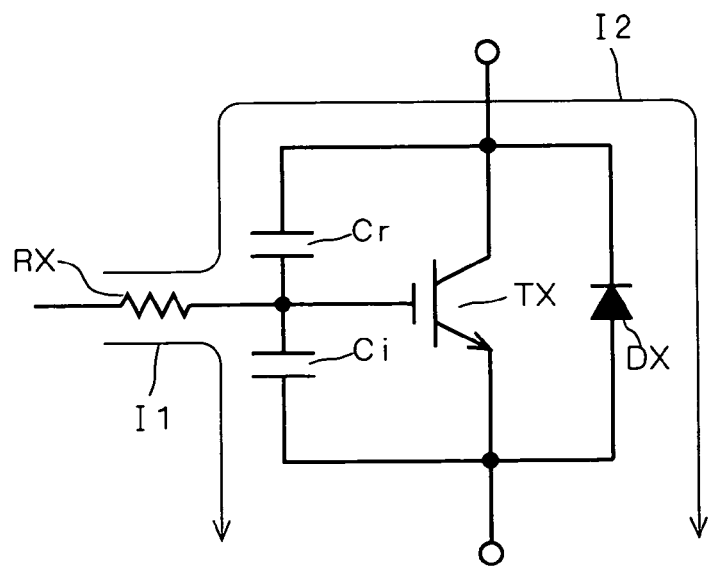
Figure 5:
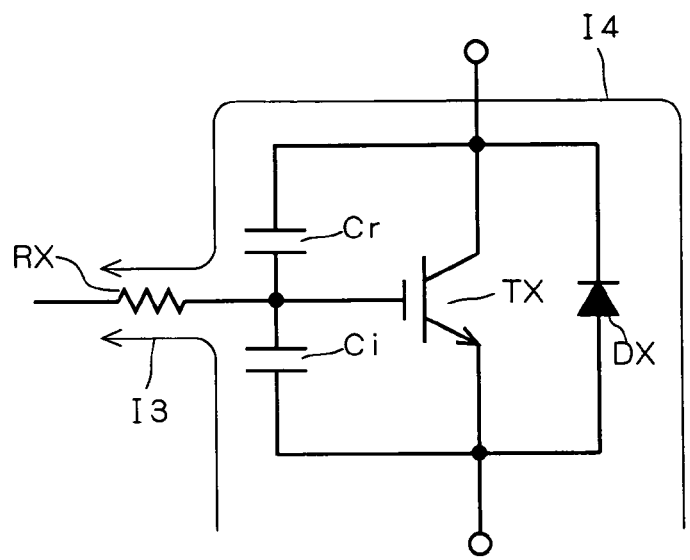
FIG. 5 schematically illustrates a current flow when the transistor is turned off.

FIG. 4 schematically illustrates a current flow when a transistor (an IGBT) TX is turned on in a configuration having the transistor TX and a diode DX connected in antiparallel to the transistor TX, and FIG. 5 schematically illustrates a current flow when the transistor TX is turned off.

As shown in FIG. 4, there exist input capacitance Ci between a gate and an emitter of the transistor TX, and feedback capacitance Cr between the gate and a collector of the transistor TX. When the transistor TX is turned on, a current I1 flows so that the input capacitance Ci becomes first charged.

Then, when a gate voltage reaches a threshold value, the transistor TX is turned on, whereby a collector voltage drops and the feedback capacitance Cr is discharged.

Meanwhile, when the transistor TX is turned off as shown in FIG. 5, a gate current reduces the gate voltage to no more than the threshold voltage due to discharge of the input capacitance Ci and tries to turn the transistor TX off, whereby the collector voltage rises and the feedback capacitance Cr becomes charged.

Thus, when the transistor TX is turned on and off, the input capacitance Ci becomes charged and discharged by the gate current, and the charging and discharging times vary depending on the resistance value of a gate resistor RX.

Namely, in the case of decreasing the resistance value of the gate resistor RX, the gate current increases and the charging and discharging times of the input capacitance Ci grow shorter, whereby a switching speed (a speed of turning on and off) to the transistor TX becomes faster. Conversely, in the case of increasing the resistance value of the gate resistor RX, the gate current decreases and the charging and discharging times of the input capacitance Ci grow longer, whereby the switching speed to the transistor TX becomes slower.

Figure 6:
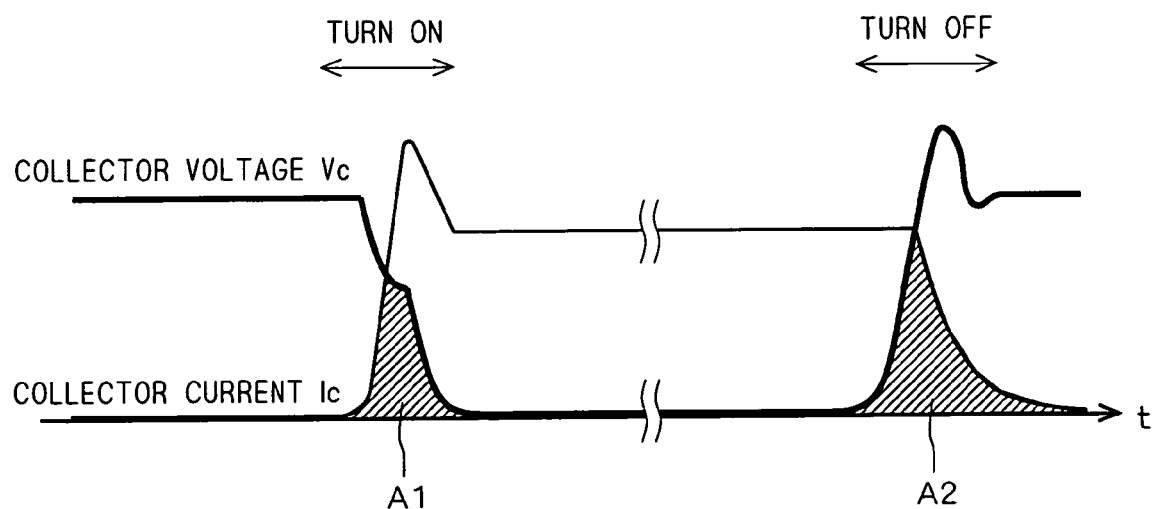
FIG. 6 illustrates performance characteristics of a switching device.

FIG. 6 illustrates performance characteristics of a switching device. As shown in FIG. 6, a surge voltage of the switching device is a collector voltage Vc standing out from its regular value and reaching its peak at turn-off time (when a collector current is interrupted), and is given by the product of a parasitic inductance of a main circuit and a current gradient (di/dt) of a main current (a collector current Ic) at turn-off time. As such, when a turn-off speed is fast, the di/dt becomes great, whereby the surge voltage increases. Conversely, when the turn-off speed is slow, the di/dt becomes small, whereby the surge voltage decreases. Namely, a decrease in the surge voltage can be attained by increasing the resistance value of a gate resistor and decreasing the turn-off speed.

However, a decrease in the turn-off speed results in an increase in power loss. Namely, as shown by hatch regions A1 and A2 in FIG. 6, a power loss at switching time is obtained by a time integral of the product of the collector current Ic and the collector voltage Vc in transient regions at turn-on time and turn-off time. As such, when the resistance value of the gate resistor increases and the di/dt becomes small, the area of the regions A1 and A2, i.e. the power loss at switching time increases. For this reason, the resistance value of the gate resistor cannot be increased without limitation in order to decrease the surge voltage.

<B-2. Snubber Circuit>

This is why snubber circuits are often used for suppressing a surge voltage. Snubber circuits used include an RC snubber circuit using a capacitor and a resistor, a non-charge type RCD snubber circuit, a charge-type RCD snubber circuit both using a capacitor, a resistor and a diode, and so on.

The inverter 100 shown in FIG. 2 is provided with a snubber composed of the capacitor 1 as the most simple snubber circuit. Alternatively, any of the aforementioned RC snubber circuit, the non-charge type RCD snubber circuit, and the charge-type RCD snubber circuit, or another snubber circuit other than the above may be used.

In any of the snubber circuits, a capacitor absorbs a surge energy. However, entering an open (opposite to short) state, the capacitor sometimes becomes zero in capacitance and cannot absorb the surge energy, resulting in a surge voltage increase in reverse. And a continued operation of a switching device with the surge voltage increasing not only applies a load to the switching device, but may impair the functions of the switching device when the surge voltage greater than the switching device's breakdown voltage is applied.

The inverter control device 110 shown in FIG. 2, which includes the voltage detection resistor 2 for detecting an operating state of the snubber circuit and provides the voltage detected at the voltage detection resistor 2 to the detected voltage monitoring device 3 to suppress the surge voltage, is capable of preventing the functions of the snubber circuit and the switching devices from being impaired. The operation of the inverter control device 110 will now be described in detail.

<B-3. Operation of Inverter Control Device>

The operation of the inverter control device 110 will be described with reference to a flowchart shown in FIG. 7.

Figure 7:
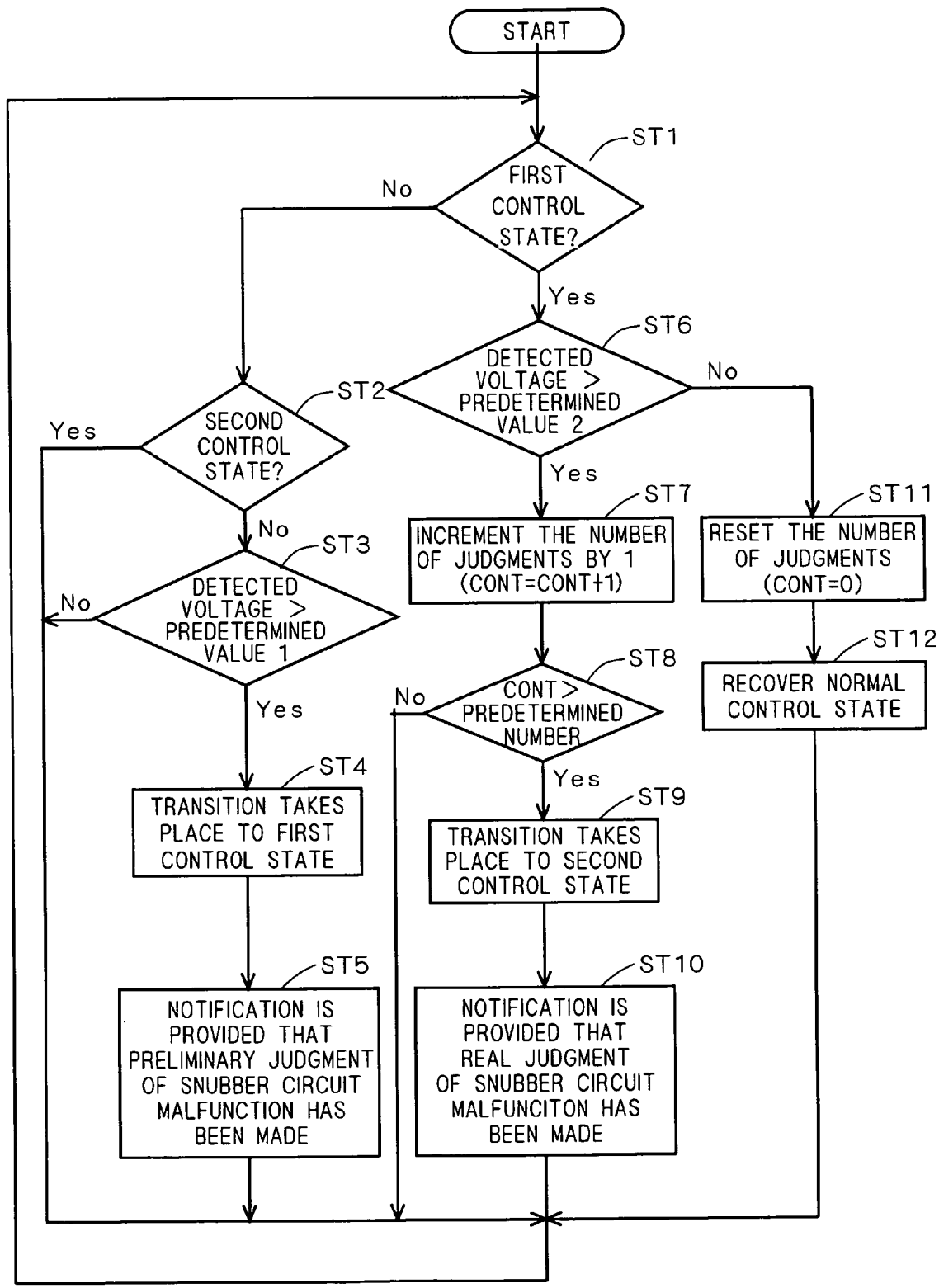
FIG. 7 is a flowchart explaining an operation of the control device of the switching devices according to the invention.

As shown in FIG. 7, after the inverter 100 starts being controlled, the detected voltage monitoring device 3 first checks the current control state. Specifically, the detected voltage monitoring device 3 checks to see whether the control state is a first control state at step ST1, and proceeds to step ST6 in the first control state, or proceeds to step ST2 not in the first control state, i.e. in the normal control state or a second control state.

The detected voltage monitoring device 3 is capable of changing the control state of the transistors T1 and T2 based on the divided voltage between the P–N lines detected at the voltage detection resistor 2. When the control state has been changed, the detected voltage monitoring device 3 can recognize the current control state by setting a flag therein corresponding to the state, for example.

<B-3-1. Transition from Normal Control State to First Control State>

At step ST2, the detected voltage monitoring device 3 checks to see whether the control state is the second control state, and proceeds to step ST3 not in the second control state, i.e. in the normal control state, or repeats an operation that follows step ST1 in the second control state.

At step ST3, the detected voltage monitoring device 3 compares the voltages detected at the voltage detection resistor 2 and a predetermined value 1. That is, the voltage detection resistor 2 measures the divided voltages between the P–N lines to be provided to the detected voltage monitoring device 3. The detected voltage monitoring device 3 monitors a maximum peak voltage, i.e. the surge voltage, and when the transistors T1 and T2 are in the normal control state, compares the predetermined value 1 and the maximum peak voltage.

The maximum peak voltage may be obtained by sampling the divided voltages provided from the voltage detection resistor 2 at arbitrary intervals, for example, by selecting a maximum voltage from the divided voltages measured for a plurality of times within a time period between the time when the driver 6 outputs an off signal and the time when a collector voltage of the transistor T1 returns to a power supply voltage and defining it as the maximum peak voltage. Alternatively, it may be obtained by continuously taking in the divided voltages provided from the voltage detection resistor 2 and detecting a maximum voltage within the time period between the time when the driver 6 outputs the off signal and the time when the collector voltage of the transistor T1 returns to the power supply voltage by a general peak detection circuit or the like.

The normal control state is a state where the gate resistances of the transistors T1 and T2 are set to correspond to the resistance values of the fixed resistors 41 and 51, respectively, and the surge voltage generated by a parasitic inductance when the snubber circuit is in a normal operating state does not exceed the breakdown voltage of the switching devices.

Accordingly, the predetermined value 1 is set to have a voltage value more than the surge voltage generated by the parasitic inductance when the snubber circuit is in the normal operating state with the gate resistance value in the normal control state, and no more than the surge voltage generated by the parasitic inductance when the snubber circuit is in the open state with the gate resistance value in the normal control state.

Then, when it is judged that the detected voltage (the maximum peak voltage) is greater than the predetermined value 1 based on the comparison made at step ST3, namely, when the surge voltage greater than it is when the snubber circuit is in the normal operating state is detected, a transition takes place from the normal control state to the first control state at step ST4. When it is judged that the detected voltage (the maximum peak voltage) is no more than the predetermined value 1, the operation that follows step ST1 is repeated.

The first control state is a state where the detected voltage monitoring device 3 outputs the variable resistor control signals S21 and S22 to control the gate resistance variable devices 4 and 5, thereby changing the gate resistance values of and accordingly the operations of the transistors T1 and T2. Specifically, as described above with reference to FIGS. 4 to 6, it is a state where the resistance value of the gate resistance is increased to decrease the turn-off speed, thereby decreasing the surge voltage.

Thus, the surge voltage can be reliably decreased because it is accomplished by varying the gate resistances.

Also as explained above, an increase in the resistance values of the gate resistances results in an increase in power loss at switching time. Accordingly, an upper limit is set on the resistance values of the gate resistances, and an adjustment range of the variable resistors 42 and 52 is set to vary between the resistance values of the fixed resistors 41 and 51 and the upper limit value.

Thus, the resistance values of the variable resistors 42 and 52 are adjusted in stages. The first control state performs a change of the first stage.

Generally, a surge voltage is set to have a value no more than the breakdown voltage of a switching device even when it is generated when a maximum current is used. Further, because an increase in the surge voltage leads to an increase in noise conducted to external devices, the surge voltage is also set to have a value in such a manner that conduction noise falls within a permissible range.

On the other hand, the present invention aims to obtain a system for suppressing the surge voltage, namely a control device capable of accomplishing the object even when a malfunction occurs in the snubber circuit, for example. As such, the present invention sets the upper limit value for the gate resistance values and the change values (the first stage value mentioned above and a second stage value described later) after making evaluations in a state without the snubber circuit, for example. The invention aims with first priority to reduce the surge voltage to no more than the breakdown voltage of the switching devices while preventing a malfunction from occurring in the switching devices due to heat caused by the power loss resulting from a change in the gate resistance values, and may give a lower priority to prevention of the conduction noise occurrence.

In the event the increase in the gate resistance values in order to reduce the surge voltage to no more than the breakdown voltage of the switching devices when the maximum current is used may not suppress the heat caused by the power loss and may cause a malfunction to occur in the switching devices, switching control of the switching devices can be changed to reduce the main current.

Namely, the transistors T1 and T2 are controlled to be turned on and off based on the pulsed control signals S6 and S7 generated by the device control signal generating device 9 (see FIG. 2), and a current value of the main current can be changed by changing the turn-on time and the turn-off time. Therefore, there may be cases where the current value of the main current is changed when the power loss due to the change in the gate resistance values poses a problem.

After the transition takes place to the first control state at step ST4, notification is provided to the outside at step ST5 that a preliminary judgment of a snubber circuit malfunction has been made.

The transition from the normal control state to the first control state takes place when the surge voltage greater than it is when the snubber circuit is in the normal operating state is detected, leaving the possibility of a malfunction such as the open state of the snubber circuit. However, the possibility is treated as the preliminary judgment since the malfunction has not been confirmed in the snubber circuit.

The possibility of the malfunction is then notified to the outside of the inverter control device 110, e.g. to a higher control system than the inverter control device 110, to enable the higher system to take action as necessary by changing the control method, for instance.

For instance, as explained above, when the switching control of the switching devices is changed to reduce the main current, the higher system is required to take appropriate action with a reduced current used for driving the motor M (see FIG. 2).

More specifically, when the inverter control device 110 is used to control a motor of a hybrid car (a car using a motor and an engine as a power source) and a driving force of the motor drops, the higher system which is provided with information that the preliminary judgment of the snubber circuit malfunction has been made is capable of taking appropriate action quickly by compensating for the dropped amount with a driving force of the engine, for example. The control device of the invention as applied to the hybrid car will be described later.

After providing the notification of the preliminary judgment of the snubber circuit malfunction to the outside at step ST5, the operation that follows step ST1 is repeated.

<B-3-2. Transition from First Control State to Second Control State>

Next, an operation will be described when the control state is judged as being the first control state at step ST1.

At step ST6, the detected voltage monitoring device 3 compares the voltages detected at the voltage detection resistor 2 and a predetermined value 2. That is, when the transistors T1 and T2 are in the first control state, the detected voltage monitoring device 3 compares the predetermined value 2 and the maximum peak voltage measured at the voltage detection resistor 2.

In the first control state, the variable resistors 42 and 52 of the gate resistance variable devices 4 and 5 are controlled to add the resistance values of the variable resistors 42 and 52 to those of the fixed resistors 41 and 51, so that the gate resistances are increased than they are in the normal control state.

Accordingly, the surge voltage is suppressed in this state. A process that follows ST6 is executed for the following reason.

That is, although the resistance values of the variable resistors 42 and 52 are changed to the first stage value in the first control state as explained above, the degree of the snubber circuit malfunction is sometimes too high for the changed gate resistance values to suppress the surge voltage to a level that does not exceed the breakdown voltage of the switching devices. Moreover, when the maximum peak voltage detected at step ST3 is a false and temporary phenomenon resulting from electromagnetic noise or the like, rather than resulting from the snubber circuit malfunction, it is inadvisable to maintain the first control state from the viewpoint of power loss.

The predetermined value 2 is set to have a voltage value more than the surge voltage generated by the parasitic inductance when the snubber circuit is in the normal operating state with the gate resistance value in the first control state, and no more than the surge voltage generated by the parasitic inductance when the snubber circuit is in the open state with the gate resistance value in the first control state.

When it is judged that the detected voltage is greater than the predetermined value 2 at step ST6, the number of judgments is incremented by 1 at step ST7. This is a process of counting the number of instances where the detected voltage is judged as being greater than the predetermined value 2 at the detected voltage monitoring device 3 when the process that follows step ST1 is repeated while maintaining the first control state.

Meanwhile, when it is judged that the detected voltage is no more than the predetermined value 2 at step ST6, the number of judgments counted at the detected voltage monitoring device 3 is reset (step ST11), the resistance values of the variable resistors 42 and 52 of the gate resistance variable devices 4 and 5 are returned to zero to recover the normal control state (step ST12), and then the operation that follows step ST1 is repeated. The recovery of the normal control state of the switching devices reduces the power loss more than necessary.

After incrementing the number of judgments (CONT) by 1 (CONT+1) at step ST7, a comparison is made between the number of judgments and a predetermined number at step ST8.

This is a process of checking to see whether the surge voltage keeps exceeding the predetermined value 2 in the first control state. When the number of judgments exceeds the predetermined number, the snubber circuit malfunction is confirmed.

Thus, when the number of judgments exceeds the predetermined number, a transition takes place from the first control state to the second control state at step ST9. When the number of judgments is no more than the predetermined number, the first control state is maintained and the operation that follows step ST1 is repeated.

The predetermined number is determined from the viewpoint of preventing erroneous judgments. Since there is a possibility that the false surge voltage will be detected resulting from the electromagnetic noise or the like as well, as explained above, the predetermined number may be set to be relatively large when the inverter control device 110 is used in an environment with much electromagnetic noise, and may be set to be several times when the inverter control device 110 is used in an environment with little noise.

In such ways, the transition to the second control state takes place after checking to see whether the surge voltage keeps exceeding the predetermined value 2. Consequently, judgment accuracy is improved.

Further, it is judged that the surge voltage keeps exceeding the predetermined value 2 when the number of judgments exceeds the predetermined number. Consequently, a judgment criterion is clear and the judgment accuracy is easily improved by changing the predetermined number.

The second control state is a state where the detected voltage monitoring device 3 outputs the variable resistor control signals S21 and S22 to control the gate resistance variable devices 4 and 5, thereby changing the gate resistance values of the transistors T1 and T2 to the second stage value and further changing the operations of the transistors T1 and T2.

When the snubber circuit malfunction is confirmed, a continued operation of the transistors T1 and T2 left in the first control state may result in a decrease in breakdown voltage ability of the transistors T1 and T2 themselves and the occurrence of a malfunction such as heat. The transition to the second control state takes place in order to further increase the gate resistance values of the transistors T1 and T2 to decrease the surge voltage, thereby protecting the transistors T1 and T2.

As explained above, however, an increase in the resistance values of the gate resistances results in an increase in power loss at switching time. Accordingly, the second stage value mentioned above is set to have a value capable of reducing the surge voltage while preventing the malfunction from occurring in the switching devices due to heat caused by the power loss.

The transition to the second control state follows the same process as the transition to the first control state. Namely, in the event the increase in the gate resistance values in order to reduce the surge voltage to no more than the breakdown voltage of the switching devices when the maximum current is used may not suppress the heat caused by the power loss and may cause a malfunction to occur in the switching devices, switching control of the switching devices can be changed to reduce the main current.

After the transition takes place to the second control state at step ST9, notification is provided to the outside (e.g. the higher system of the inverter control device 110) at step ST10 that a real judgment of the snubber circuit malfunction has been made.

The transition from the first control state to the second control state takes place when a malfunction occurs where the snubber circuit enters the open state, for example. Accordingly, the snubber circuit malfunction is confirmed.

The higher system which is informed that the snubber circuit malfunction has been confirmed stops the system operation where possible. When it cannot stop the system operation in such case as a car, the higher system controls an upper limit speed, changes system control so that the malfunction becomes clear to a driver, or warns the driver of the malfunction.

Thus, the higher system receives the possible malfunction information or the malfunction information in the snubber circuit. Consequently, the malfunction can be positively prevented from occurring in the switching devices.

After providing the notification of the real judgment of the snubber circuit malfunction to the outside at step ST10, the operation that follows step ST1 is repeated.

<C. Effect>

As discussed above, according to the preferred embodiment of the control device of the switching devices of the invention, a malfunction is prevented from occurring in the switching devices by monitoring the surge voltage to detect the snubber circuit malfunction, and providing the notification of the snubber circuit malfunction to the higher system.

Further, in detecting the snubber circuit malfunction, the predetermined values 1 and 2 that are set based on the surge voltage are used as an index of the malfunction judgment and the malfunction judgment is made in two stages. Consequently, the occurrence of erroneous judgments is reduced.

<D. Modification 1>

It is not essential to execute the exemplary step of providing the notification of the preliminary judgment of the snubber circuit malfunction to the outside at step ST5 after the transition to the first control state, which was described with reference FIG. 7.

As explained above, the preliminary judgment, which is made when there is a possibility of the snubber circuit malfunction, may be made frequently in the environment with much electromagnetic noise. If the preliminary judgment is notified to the higher system and the like each time it is made, loads to the higher system and communication lines for handling the judgment are increased. Therefore, the step of providing the notification of the preliminary judgment to the outside may be deleted in the first place, or may be omitted at an operator's discretion.

Consequently, the increase of the loads to the higher system and the communication lines is prevented and the higher system operation can be smoothly performed.

<E. Modification 2>

While the invention is presented in the inverter control device 110 constituting the inverter 100 in the preferred embodiment explained above with reference to FIGS. 1 and 2, it is not restricted to an inverter control device. Alternatively, the invention may be presented in a control device of a converter.

A converter has functions opposite to those of an inverter, yet has a similar device configuration as that of an inverter. Therefore, the invention is also similarly presented.

<F. Modification 3>

In the preferred embodiment explained above with reference to FIG. 2, the gate resistances of the transistors T1 and T2 totem-pole-connected between the P–N lines are changed together. Alternatively, when the main current does not flow to the high-potential side device as much as to the low-potential side device and the surge voltage does not exceed the breakdown voltage of the high-potential side device regardless of the presence or absence of the snubber circuit, the structure for changing the gate resistances may be provided only on the low-potential side device.

Conversely, when the main current does not flow to the low-potential side device as much as to the high-potential side device and the surge voltage does not exceed the breakdown voltage of the low-potential side device regardless of the presence or absence of the snubber circuit, the structure for changing the gate resistances may be provided only on the high-potential side device.

<G. Application Example to Hybrid Car>

Figure 8:
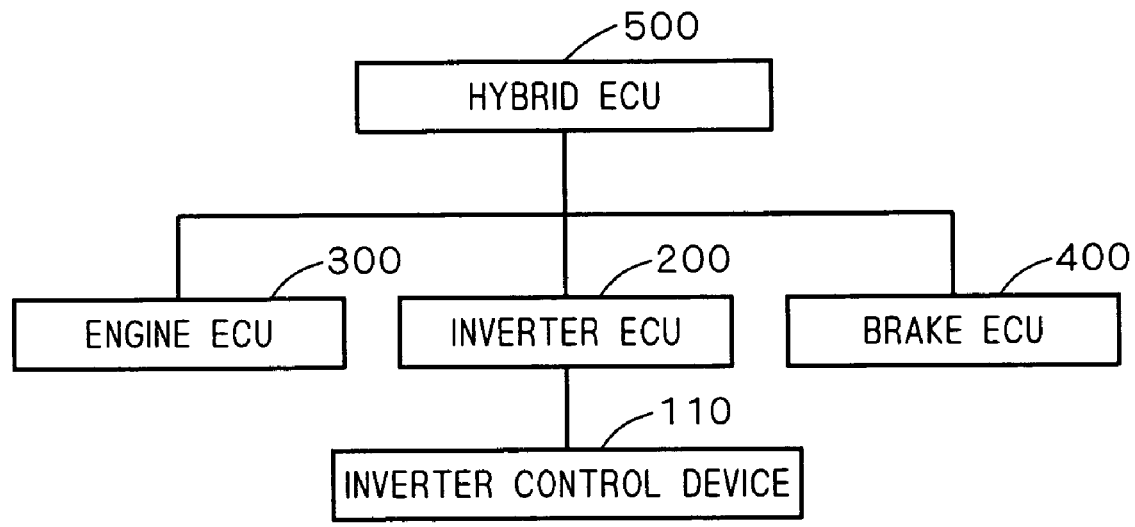
FIG. 8 is a block diagram illustrating a configuration of a vehicle control system of a hybrid car.
Figure 9:
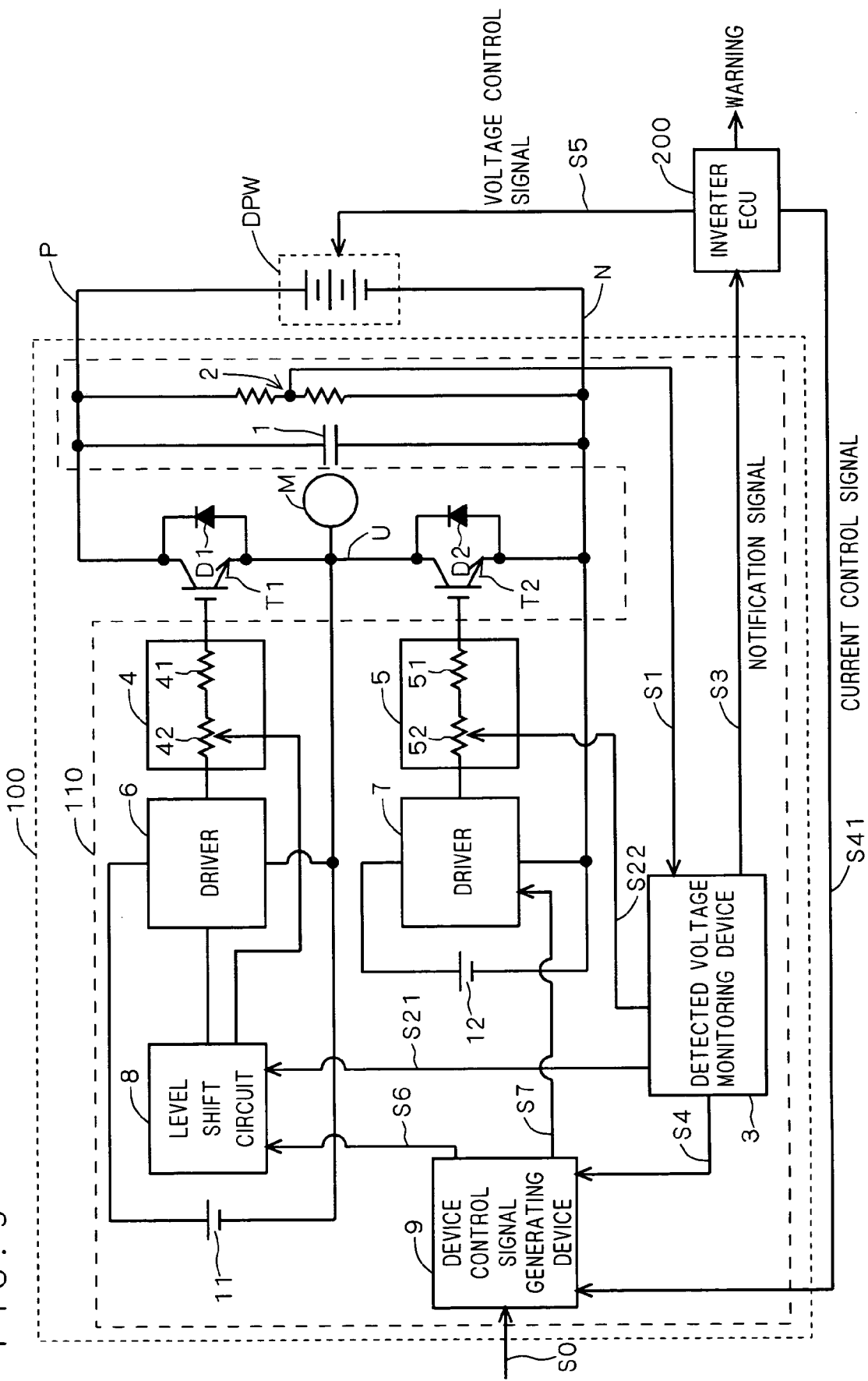
FIG. 9 illustrates a configuration of the inverter including the control device of the switching devices according to the invention as applied to an inverter of the hybrid car.
Figure 10:
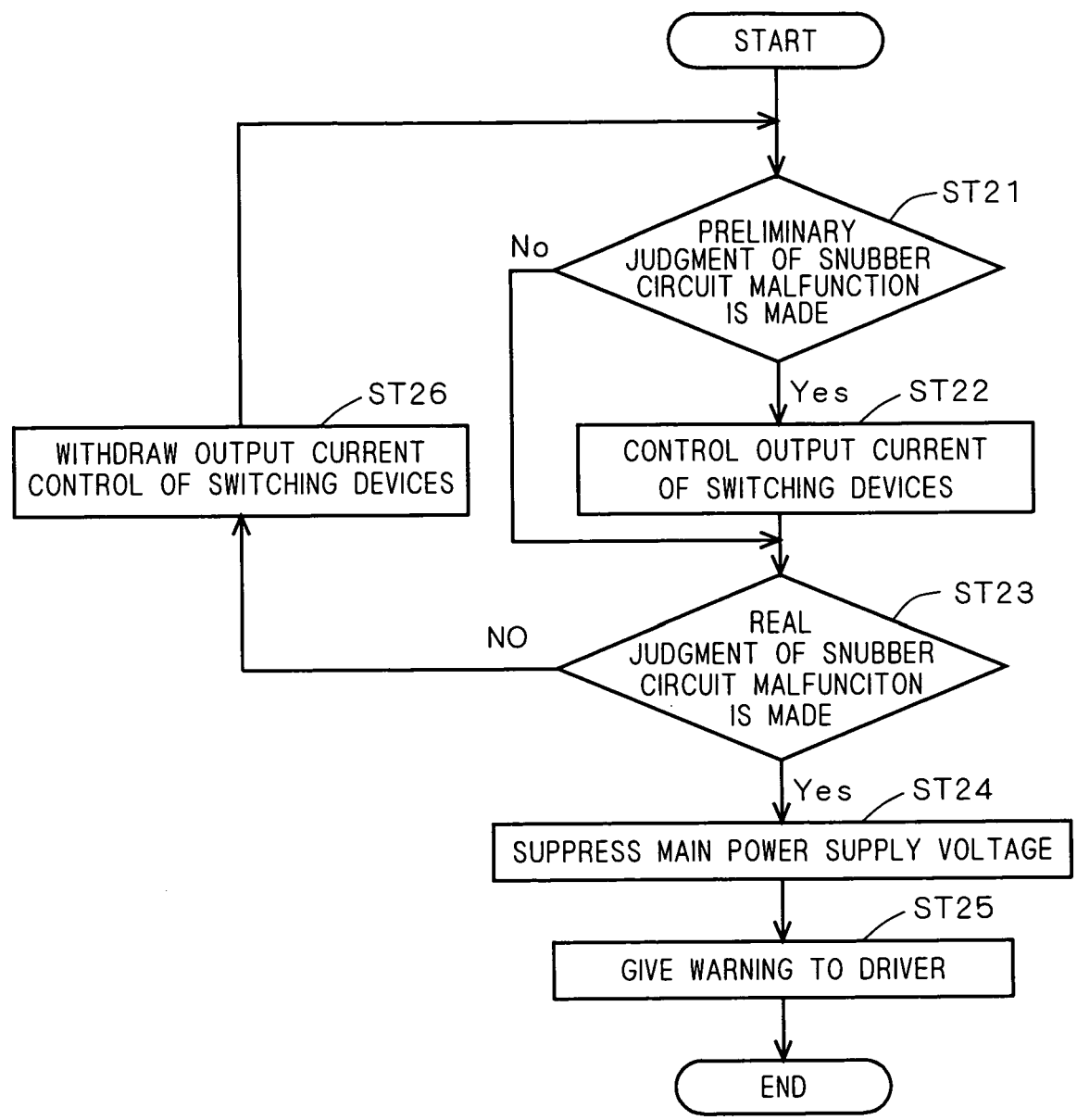
FIG. 10 is a flowchart explaining an operation of a higher system of the inverter of the hybrid car.

FIGS. 8 to 10 illustrates a configuration and an operation of the inverter control device 110 explained with reference to FIG. 2 as applied to an inverter of the hybrid car.

FIG. 8 is a block diagram illustrating a configuration of a vehicle control system of the hybrid car. As shown in FIG. 8, the vehicle control system of the hybrid car has a hybrid ECU (Electronic Control Unit) 500 for unifying a control of the whole vehicle as the highest system, and therebelow an inverter ECU 200 for unifying a control of an inverter, an engine ECU 300 for unifying a control of an engine, a brake ECU 400 for unifying a control of a brake, and so forth, the inverter control device 110 being a lower system of the inverter ECU 200.

FIG. 9 illustrates a configuration of the inverter control device 110 as applied to the inverter of the hybrid car.

As shown in FIG. 9, the notification signal S3 output to the outside from the detected voltage monitoring device 3 is provided to the inverter ECU 200 serving as a higher system of the inverter control device 110. The inverter ECU 200 has functions of providing a current control signal S41 to the device control signal generating device 9 based on the notification signal S3 to control the main current flowing to the transistors T1 and T2, and providing a voltage control signal S5 to the main power supply DPW to control an output voltage. The main current flowing to the transistors T1 and T2 may be controlled by changing the input signal S0 for controlling the device control signal generating device 9 rather than providing the current control signal S41 to the device control signal generating device 9. The input signal S0, which is generated by the inverter ECU 200, may be easily changed.

FIG. 10 is a flowchart explaining an operation of the inverter ECU 200.

As shown in FIG. 10, the inverter ECU 200 first checks to see whether the notification is provided as the notification signal S3 from the inverter control device 110 that the preliminary judgment of the snubber circuit malfunction has been made (step ST21), and when the notification is provided, provides the current control signal S41 to the device control signal generating device 9 to change the turn-on time and the turn-off time of the transistors T1 and T2, thereby controlling the main current flowing to the transistors T1 and T2, namely, an output current (step ST22). In this case, the output current is controlled so that the sum of the surge voltage and operating voltages of the switching devices does not exceed the breakdown voltage of the switching devices.

The main current control is sometimes performed by the detected voltage monitoring device 3 which provides the current control signal S41 to the device control signal generating device 9 as required. Alternatively, when the preliminary judgment is made as above, the main current control may be performed unconditionally by the inverter ECU 200.

Besides, when the functions of the detected voltage monitoring device 3 are included in the inverter ECU 200, namely, when the detected voltage monitoring device 3 is realized by part of functions of a microcomputer constituting the inverter ECU 200, the detected voltage monitoring device 3 and the inverter ECU 200 are not distinctly divided in configuration. In such case, the main current control of the switching devices performed by the detected voltage monitoring device 3 is equal to the main current control of the switching devices performed by the inverter ECU 200.

When the notification is not provided that the preliminary judgment of the snubber circuit malfunction has been made at step ST21, the inverter ECU 200 proceeds to step ST23 to check to see whether the notification is provided as the notification signal S3 from the inverter control device 110 that the real judgment of the snubber circuit malfunction has been made.

When the notification is provided, the inverter ECU 200 provides the voltage control signal S5 to the main power supply DPW to decrease the output voltage, so that the sum of the surge voltage and the operating voltages of the switching devices does not exceed the breakdown voltage of the switching devices (step ST24). Then, the inverter ECU 200 warns the driver of the snubber circuit malfunction (step ST25).

The output voltage control of the main power supply DPW may be realized by controlling a boosted voltage of the booster circuit BV shown in FIG. 1, for example, or by using a variable DC power supply for the power supply PW serving as a supply of the main power supply DPW, thereby controlling the power supply PW.

When the notification is not provided that the real judgment of the snubber circuit malfunction has been made at step ST23, it means that the preliminary judgment is withdrawn and the normal control state is recovered. Namely, even when the preliminary judgment of the snubber circuit malfunction is made from the inverter control device 110, if the surge voltage keeps a smaller value than the predetermined value 2 in the first control state, the switching devices are controlled to recover the normal control state (step ST12) as described with reference to FIG. 7. Accordingly, after the notification is provided that the preliminary judgment of the snubber circuit malfunction has been made at step ST21, if the notification is not provided that the real judgment of the snubber circuit malfunction has been made after a predetermined period (a period required for the transition to the second control state to take place after going through step ST9 shown in FIG. 7) has passed, the output current control of the switching devices is withdrawn, and the operation that follows step ST 21 is repeated.

As such, the inverter ECU 200 serving as the higher system of the inverter control system 110 performs a protective operation of the switching devices based on the preliminary judgment and the real judgment of the snubber circuit malfunction provided from the inverter control device 110 while warning the driver of the snubber circuit malfunction. Consequently, the car's operation is prevented from being interfered with.

Moreover, the output current control of the switching devices is withdrawn when the switching devices control recovers the normal control state. Consequently, the possibility of limiting the car's operation is reduced.

The foregoing explains that after the notification is provided that the preliminary judgment of the snubber circuit malfunction has been made, if the notification is not provided that the real judgment of the snubber circuit malfunction has been made after the predetermined period (the period required for the transition to the second control state to take place after going through step ST9 shown in FIG. 7) has passed, the higher system withdraws the output current control of the switching devices assuming that the switching devices control has recovered the normal control state. Alternatively, the inverter control device 110 may provide information on the recovery of the normal control state to the higher system, and the higher system which receives the information may withdraw the output current control of the switching devices.

<H. Application Example to Booster Circuit>

While the foregoing illustrates examples of the control device of the invention as applied to control the switching devices totem-pole-connected between the P–N lines, that is not restrictive. Alternatively, the control device of the invention may be applied to control a switching device constituting a booster circuit.

Figure 11:
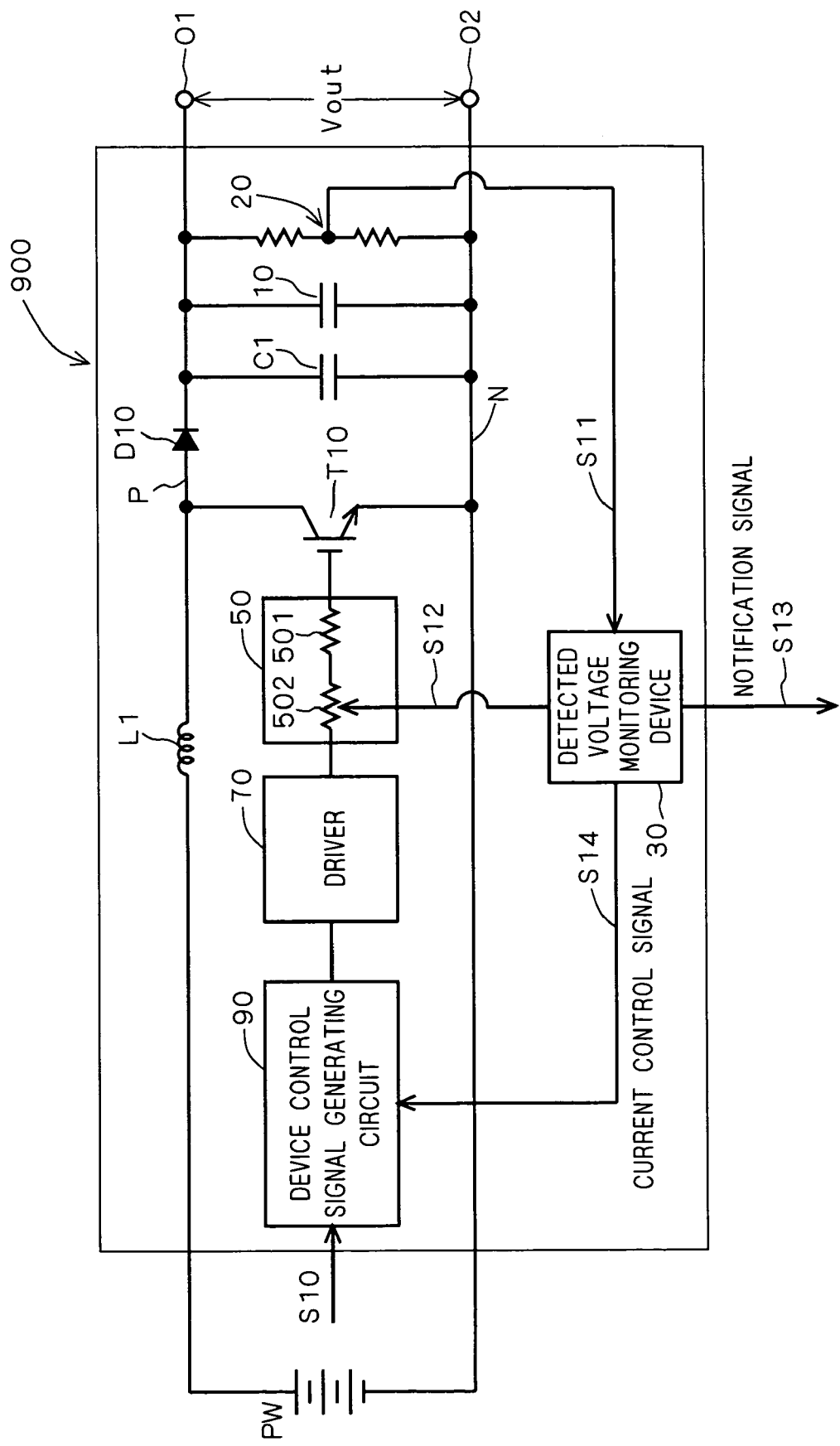
FIG. 11 illustrates a configuration of the control device of the switching devices according to the invention as applied to a booster circuit.

FIG. 11 illustrates a concrete configuration. As shown in FIG. 11, a booster circuit 900 includes a transistor T10 which is a power device such as an IGBT disposed between P–N lines of a power supply PW and a capacitor C1, a diode D10 having an anode connected to a drain of the transistor T10 and a cathode connected to a P-line side electrode of the capacitor C1, and an inductor L1 connected between the drain of the transistor T10 and a positive electrode of the power supply PW, as a configuration for boosting a voltage. A voltage detection resistor (voltage detection device) 20 for detecting a voltage between the P–N lines by dividing resistances to detect a surge voltage of the transistor T10 is disposed between the P–N lines, and a boosted voltage (Vout) is output between output terminals 01 and 02 of the P-line and the N-line, respectively. A capacitor 10 constituting a snubber circuit is disposed between the P–N lines.

The transistor T10 is driven by a gate control signal provided from a driver (driving device) 70, and the driver 70 is controlled by a device control signal generating device 90. The device control signal generating device 90 is controlled by an input signal S10 provided from an outside of the booster circuit 900.

Further, the gate control signal which is an output from the driver 70 is provided to the transistor T10 through a gate resistance variable device (control state changing device) 50.

The gate resistance variable device 50 includes a fixed resistor 501 and a variable resistor 502, and the resistance value of the variable resistor 502 is controlled based on a variable resistor control signal S12 provided from a detected voltage monitoring device 30.

The variable resistor 502 is configured in the same way as the variable resistor 52 as described with reference to FIG. 3, and thus its description is omitted.

The detected voltage monitoring device 30 receives the voltage detected at the voltage detection resistor 20 as a signal S11, has functions of determining the necessity for changing a control state of the transistor T10 based on a comparison result between the signal S11 and a predetermined value, generating and outputting the variable resistor control signals S12 based on the determination result, and when the control state of the transistor T10 has been changed, outputting a notification signal S13 to that effect to the outside, and is constituted by including a microcomputer, for example.

The detected voltage monitoring device 30 also has a function of providing the device control signal generating device 90 with a current control signal S14, thereby controlling a main current flowing to the transistor T10.

With the similar process as that of the inverter control device 110 as described with reference to FIG. 7, the booster circuit 900 having such configuration is capable of judging a state in which the snubber circuit is in, and providing notification of the judgment result to the outside.

The booster circuit 900 shown in FIG. 11 may be used as the booster circuit BV constituting the main power supply DPW of the inverter 100 shown in FIG. 1.

While the invention has been shown and described in detail, the foregoing description is in all aspects illustrative and not restrictive. It is therefore understood that numerous modifications and variations can be devised without departing from the scope of the invention.

What is claimed is:

1. A control device of switching devices, comprising:
   driving devices configured to performing drive and control of said switching devices;
   a snubber circuit configured to suppress a surge voltage generated during a switching operation of said switching devices;
   a voltage detection device configured to detect a voltage between main electrodes of said switching devices;
   a detected voltage monitoring device configured to monitor the voltage detected by said voltage detection device to detect said surge voltage; and
   control state changing devices configured to change a control state of said switching devices based on instructions provided from said detected voltage monitoring device, wherein
   said detected voltage monitoring device has first and second predetermined values to be compared with said surge voltage, and suppresses said surge voltage by:
   a provision of instructions to said control state changing devices so that a transition of the control state of said switching devices takes place from a normal control state to a first control state when said surge voltage exceeds said first predetermined value, and
   a provision of instructions to said control state changing devices so that a transition of the control state of said switching devices takes place from said first control state to a second control state when said surge voltage exceeds said second predetermined value while said switching devices are in said first control state.

2. The control device of the switching devices according to claim 1, wherein
   said detected voltage monitoring device is configured to provide instructions to said control state changing devices so that the control state of said switching devices recovers said normal control state from said first control state when said surge voltage maintains a value no more than said second predetermined value while said switching devices are in said first control state.

3. The control device of the switching devices according to claim 2, wherein
   said detected voltage monitoring device is configured to provide instructions to said control state changing devices so that a transition of the control state of said switching devices takes place from said first control state to said second control state only when said surge voltage keeps exceeding said second predetermined value while said switching devices are in said first control state.

4. The control device of the switching devices according to claim 3, wherein
   said detected voltage monitoring device is configurd to repeat comparison judgments between said surge voltage and said second predetermined value when said switching devices are in said first control state, and to judge that said surge voltage keeps exceeding said second predetermined value when the number of instances where said surge voltage is judged as exceeding said second predetermined value exceeds a predetermined number of judgments.

5. The control device of the switching devices according to claim 2, wherein
   said detected voltage monitoring device has functions of:
   providing information to a higher system of said control device about said transition of the control state of said switching devices to said first control state when said transition takes place, and
   providing information to said higher system of said control device about said transition of the control state of said switching devices to said second control state when said transition takes place.

6. The control device of the switching devices according to claim 2, wherein
   said detected voltage monitoring device has a function of providing information to a higher system of said control device about said transition of the control state of said switching devices to said second control state when said transition takes place.

7. The control device of the switching devices according to claim 5, wherein
   said higher system is configurd to receive information about said transition to said first control state and information about said transition to said second control state to perform operation control of said switching devices in accordance with said transitions, respectively, and to withdraw said operation control of said switching devices in accordance with said transition to said first control state when the control state of said switching devices recovers said normal control state from said first control state and information about said transition to said second control state is not provided.

8. The control device of the switching devices according to claim 1, wherein
   said control state changing devices include gate resistance variable devices changing gate resistances of said switching devices,
   said gate resistance variable devices have a function of changing said gate resistances of said switching devices in stages,
   said first control state includes a control state where said gate resistances of said switching devices are increased from a resistance value in said normal control state to a first resistance value, thereby decreasing a turn-off speed of said switching devices, and
   said second control state includes a control state where said gate resistances of said switching devices are increased from said first resistance value to a second resistance value, thereby reducing said turn-off speed of said switching devices.

9. A control device of a driving circuit of a motor, said motor being included as a driving source of a car, wherein
   said control device comprises said control device of said switching devices recited in claim 1.

* * * * *